(12) United States Patent
Huang et al.

(10) Patent No.: US 10,109,663 B2
(45) Date of Patent: Oct. 23, 2018

(54) CHIP PACKAGE AND METHOD FOR FORMING THE SAME

(71) Applicant: XINTEC INC., Taoyuan (TW)

(72) Inventors: Yu-Lung Huang, Taoyuan (TW); Tsang-Yu Liu, Zhubei (TW); Yi-Ming Chang, Taoyuan (TW); Hsin Kuan, Zhubei (TW)

(73) Assignee: XINTEC INC., Taoyuan (TW)

( * ) Notice: Subject to any disclaimer, the term of this patent is extended or adjusted under 35 U.S.C. 154(b) by 88 days.

(21) Appl. No.: 15/258,594

(22) Filed: Sep. 7, 2016

(65) Prior Publication Data

US 2017/0077158 A1 Mar. 16, 2017

Related U.S. Application Data

(60) Provisional application No. 62/216,877, filed on Sep. 10, 2015.

(51) Int. Cl.
*H01L 27/146* (2006.01)

(52) U.S. Cl.
CPC .. *H01L 27/14623* (2013.01); *H01L 27/14618* (2013.01); *H01L 27/14685* (2013.01); *H01L 27/14634* (2013.01)

(58) Field of Classification Search
CPC .............. H01L 27/14623; H01L 27/14618
See application file for complete search history.

(56) References Cited

U.S. PATENT DOCUMENTS

| | | | |
|---|---|---|---|
| 2010/0085465 A1* | 4/2010 | Shiung | G03B 17/00 348/340 |
| 2011/0286736 A1* | 11/2011 | Aizawa | H01L 27/14618 396/529 |

FOREIGN PATENT DOCUMENTS

| | | |
|---|---|---|
| CN | 102270618 | 12/2011 |
| CN | 204632759 | 9/2015 |

* cited by examiner

*Primary Examiner* — Marc Armand
(74) *Attorney, Agent, or Firm* — Liu & Liu

(57) ABSTRACT

A chip package including a substrate is provided. The substrate has a first surface and a second surface opposite thereto. The substrate includes a sensing region. A cover plate is on the first surface and covers the sensing region. A shielding layer covers a sidewall of the cover plate and extends towards the second surface. The shielding layer has an inner surface adjacent to the cover plate and has an outer surface away from the cover plate. The length of the outer surface extending towards the second surface is less than that of the inner surface extending towards the second surface, and is not less than that of the sidewall of the cover plate. A method of forming the chip package is also provided.

22 Claims, 8 Drawing Sheets

CHIP PACKAGE AND METHOD FOR FORMING THE SAME

CROSS REFERENCE TO RELATED APPLICATIONS

This Application claims priority of U.S. Provisional Application No. 62/216,877, filed Sep. 10, 2015, the entirety of which is incorporated by reference herein.

BACKGROUND OF THE INVENTION

Field of the Invention

The invention relates to chip package technology, and in particular to a chip package having a shielding layer and methods for forming the same.

Description of the Related Art

Optoelectronic devices (e.g. a light-sensing device) play an important role in capturing images and have been widely used in electronic products such as digital cameras, digital video recorders, and mobile phones. The chip packaging process is an important step in the fabrication of electronic products. Chip packages not only protect the chips therein from outer environmental contaminants but also provide electrical connection paths between the electronic elements inside and those outside of the chip packages.

As technology develops, the requirements for a light-sensing device having a high sensing accuracy have increased. Thus, there exists a need in the art for the development of a chip package and methods for forming the same, capable of providing a photosensitive chip package having a high sensing accuracy.

BRIEF SUMMARY OF THE INVENTION

An embodiment of the invention provides a chip package comprising a substrate having a first surface and a second surface opposite thereto, wherein the substrate comprises a sensing region. A cover plate is located on the first surface, and covers the sensing region. A shielding layer covers a sidewall of the cover plate and extends toward the second surface, wherein the shielding layer has an inner surface which is adjacent to the cover plate and an outer surface which is facing away from the cover plate. The length of the outer surface extending toward the second surface is less than the length of the inner surface extending toward the second surface, but it is not less than the length of the sidewall of the cover plate.

An embodiment of the invention provides a method for forming a chip package, comprising providing a substrate having a first surface and a second surface opposite thereto, and the substrate comprising a sensing region. The method provides a cover plate on the first surface to cover the sensing region. A shielding layer is formed to cover a sidewall of the cover plate, and to extend toward the second surface, wherein the shielding layer has an inner surface which is adjacent to the cover plate and an outer surface which is facing away from the cover plate. The length of the outer surface extending toward the second surface is less than the length of the inner surface extending toward the second surface, but it is not less than the length of the sidewall.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of some embodiments of the present disclosure are discussed in detail below. However, it should be noted that some embodiments provide many applicable inventive concepts that can be embodied in a variety of specific methods. The specific embodiments discussed are merely illustrative of specific methods to make and use some embodiments, and do not limit the scope of the disclosure. The disclosed contents of the present disclosure include all some embodiments derived from claims of the present disclosure by those skilled in the art. In addition, the present disclosure may repeat reference numbers and/or letters in the various embodiments. This repetition is for the purpose of simplicity and clarity, and does not imply any relationship between the different embodiments and/or configurations discussed. Furthermore, when a first layer is referred to as being on or overlying a second layer, the first layer may be in direct contact with the second layer, or spaced apart from the second layer by one or more material layers.

A chip package according to an embodiment of the present invention may be used to package micro-electromechanical system chips. However, embodiments of the invention are not limited thereto. For example, the chip package of some embodiments of the invention may be implemented to package active or passive devices or electronic components of integrated circuits, such as digital or analog circuits. For example, the chip package is related to optoelectronic devices, micro-electro-mechanical systems (MEMS), biometric devices, microfluidic systems, and physical sensors measuring changes to physical quantities such as heat, light, capacitance, pressure, and so on. In particular, a wafer-level packaging (WSP) process may optionally be used to package semiconductor chips, such as image-sensor elements, light-emitting diodes (LEDs), solar cells, RF circuits, accelerators, gyroscopes, fingerprint recognition devices, microactuators, surface acoustic wave devices, pressure sensors, ink printer heads, and so on.

The above-mentioned wafer-level packaging process mainly means that after the packaging step is accomplished during the wafer stage, the wafer with chips is cut to obtain individual packages. However, in a specific embodiment, separated semiconductor chips may be redistributed on a carrier wafer and then packaged, which may also be referred to as a wafer-level packaging process. In addition, the above-mentioned wafer-level ackaging process may also be adapted to form a chip package having multilayer integrated circuit devices by stacking a plurality of wafers having integrated circuits or to form a system-in-package (SIP).

Figure 1A:
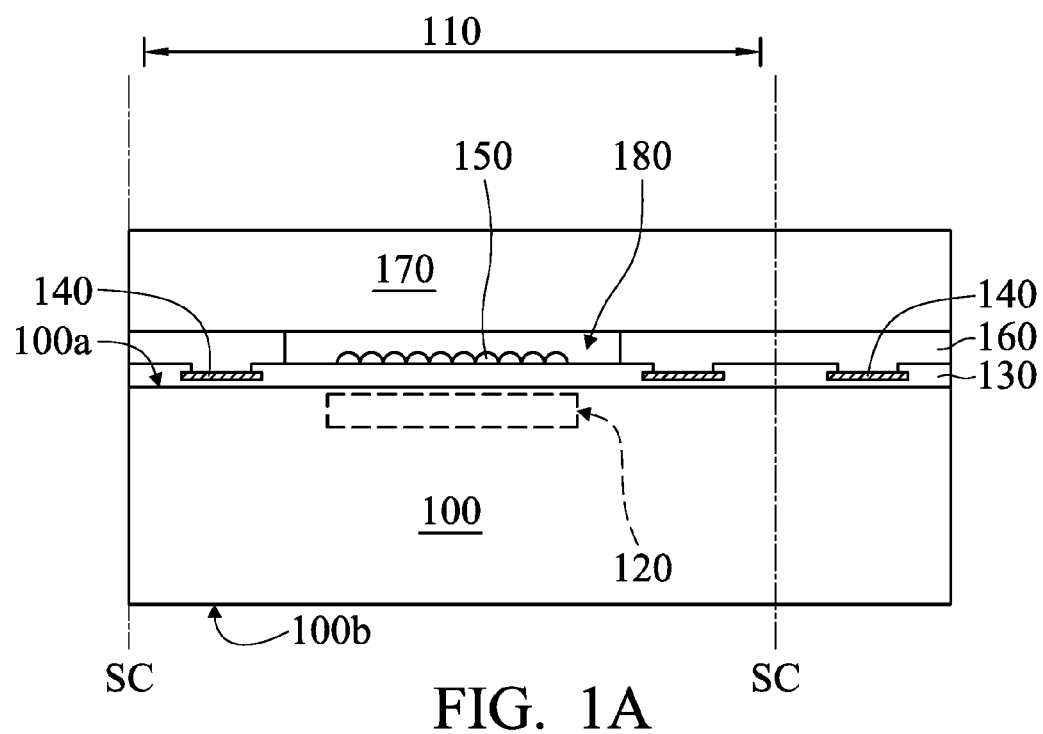
FIGS. 1A to 1I are cross-sectional views of an exemplary embodiment of a method for forming a chip package according to the invention.
Figure 1B:
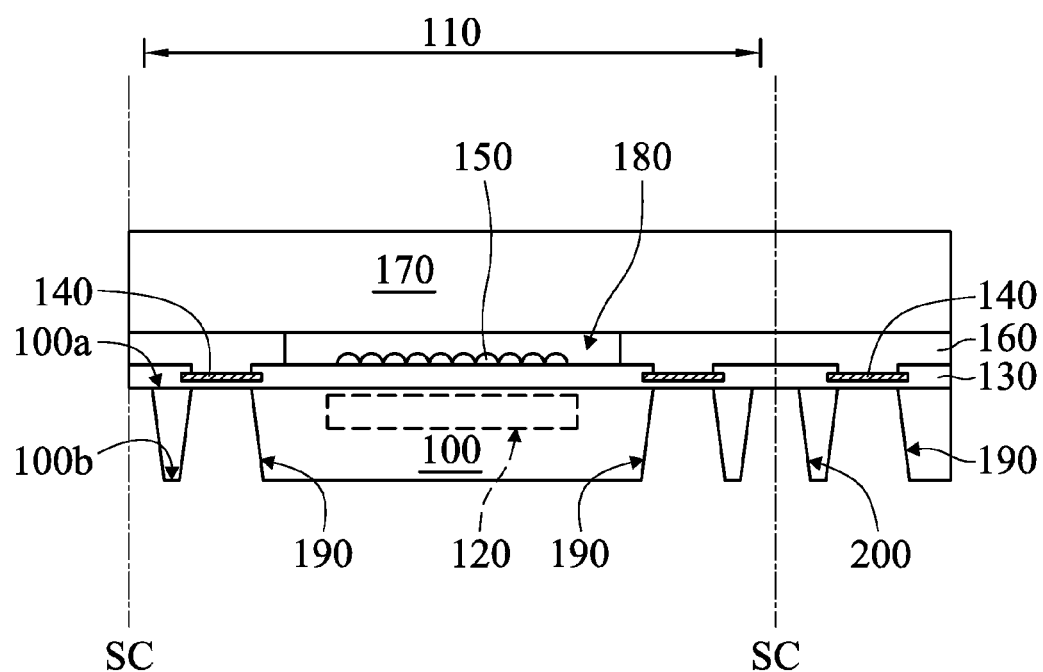
Figure 1C:
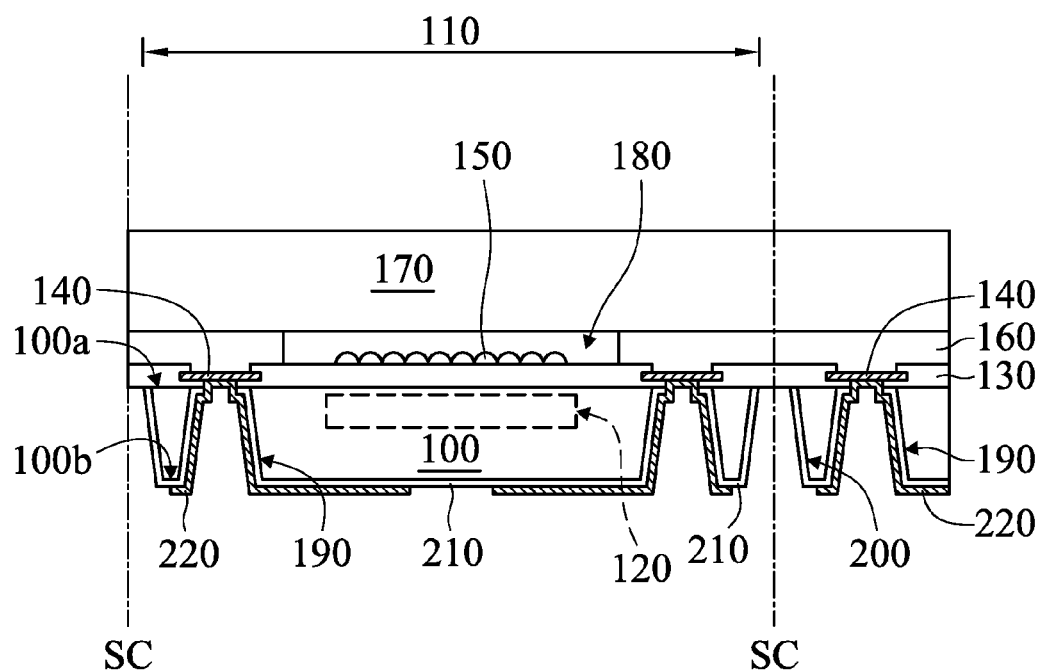
Figure 1D:
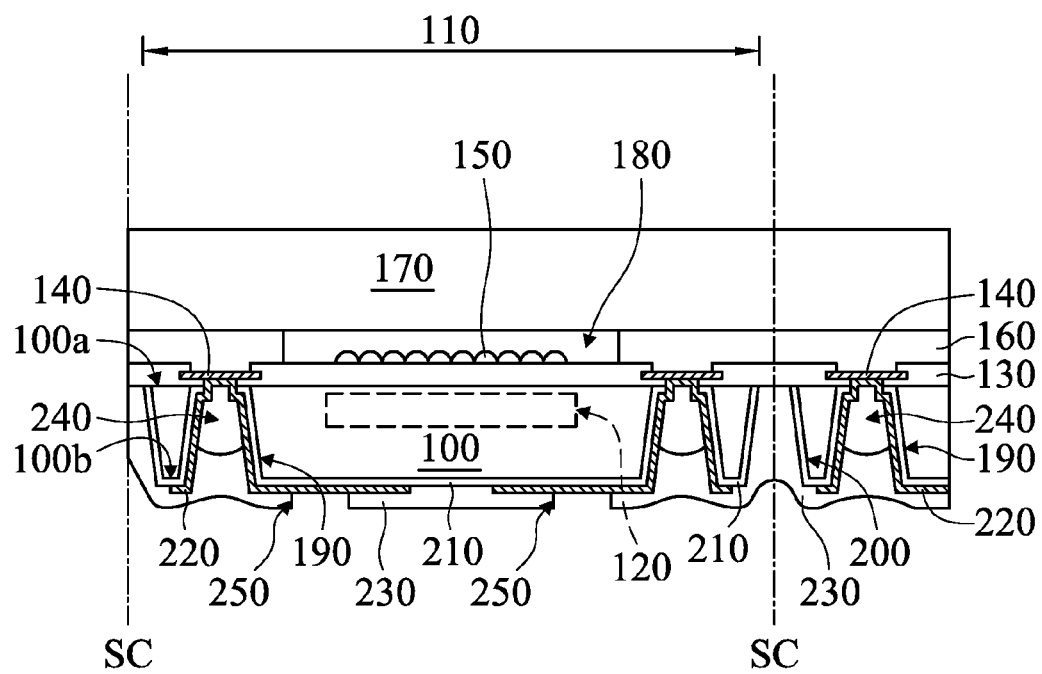
Figure 1E:
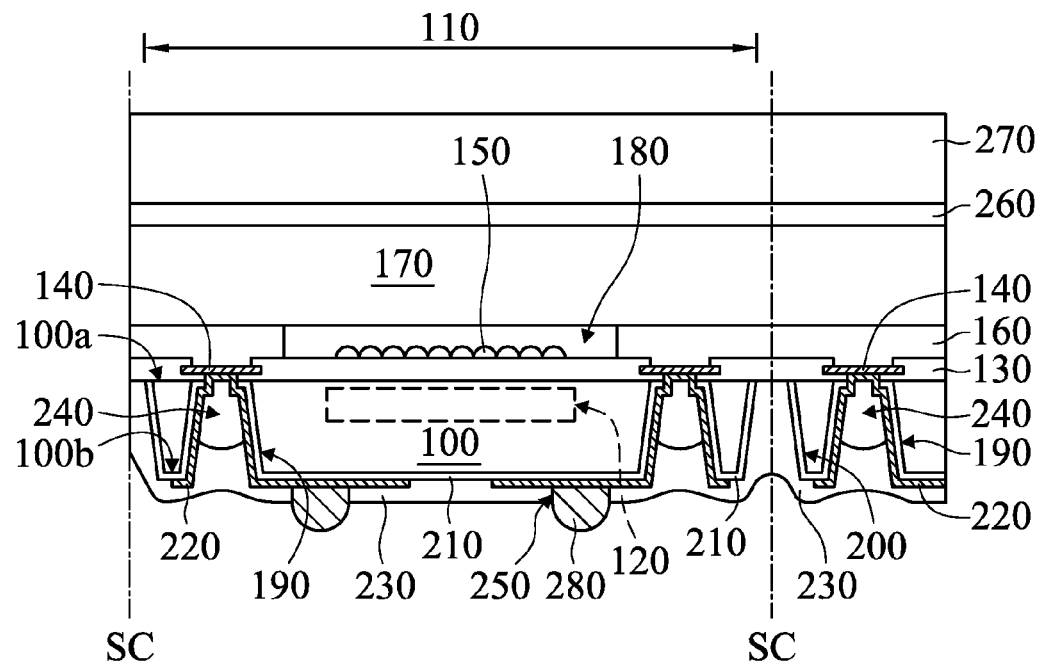
Figure 1F:
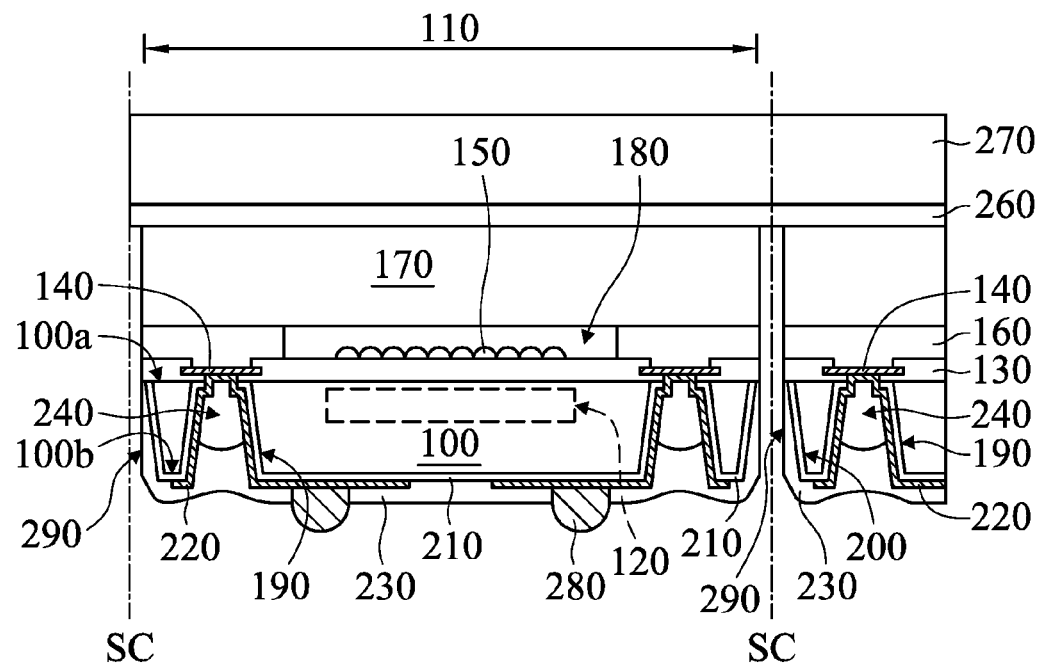
Figure 1G:
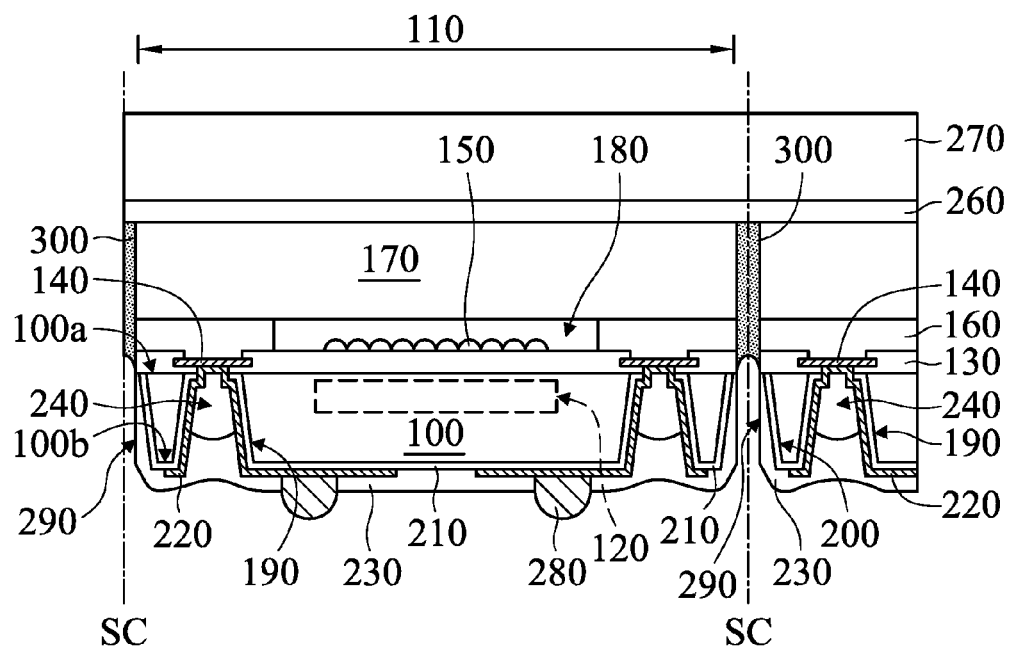
Figure 1H:
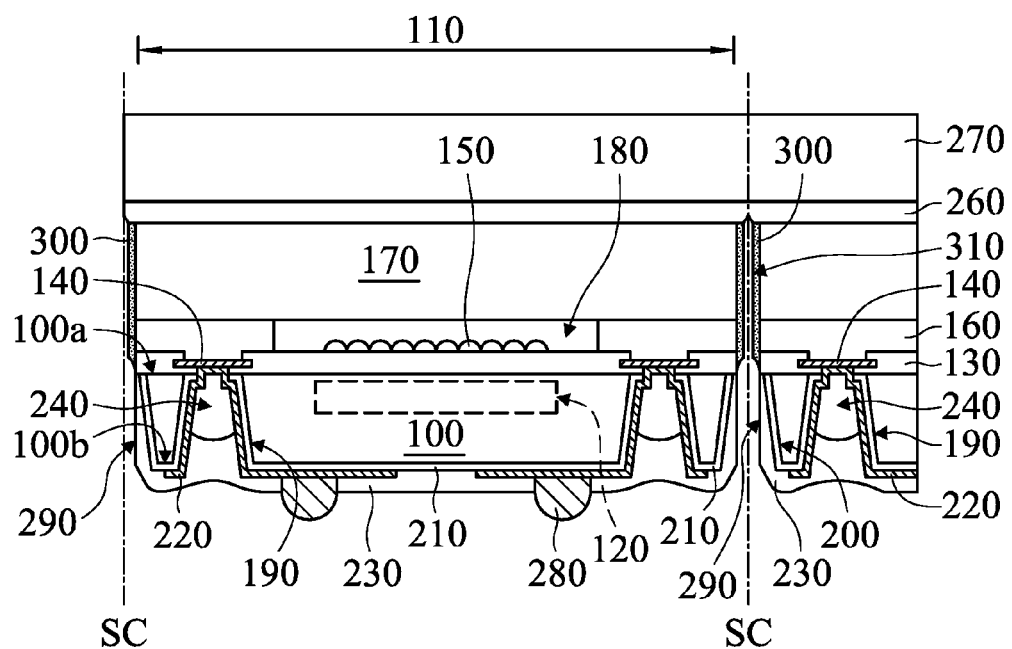
Figure 1I:
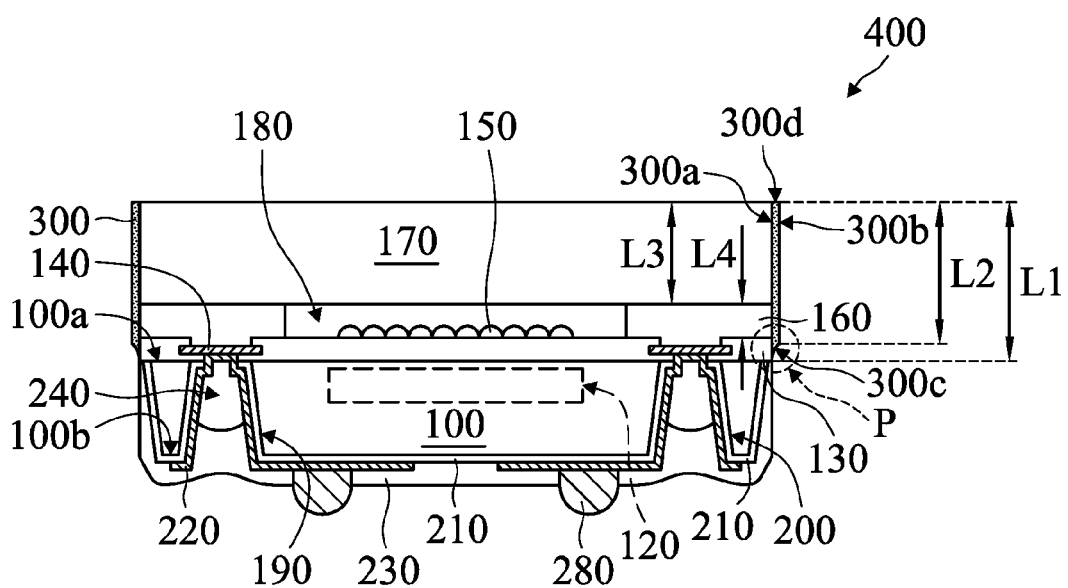
Figure 3A:
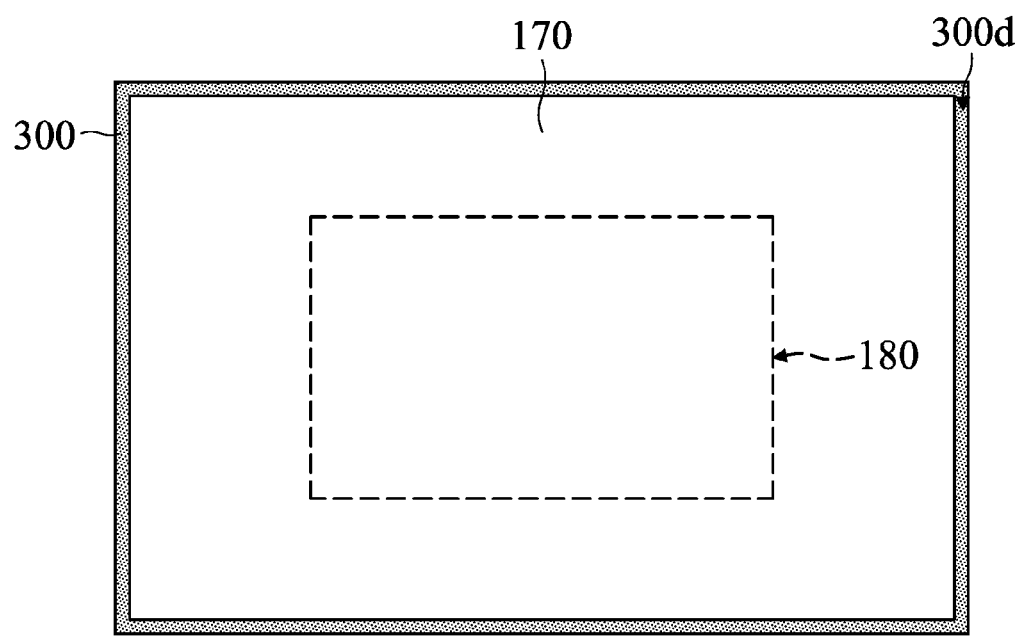
FIGS. 3A to 3B are top views of various exemplary embodiments of a chip package according to the invention.
Figure 3B:
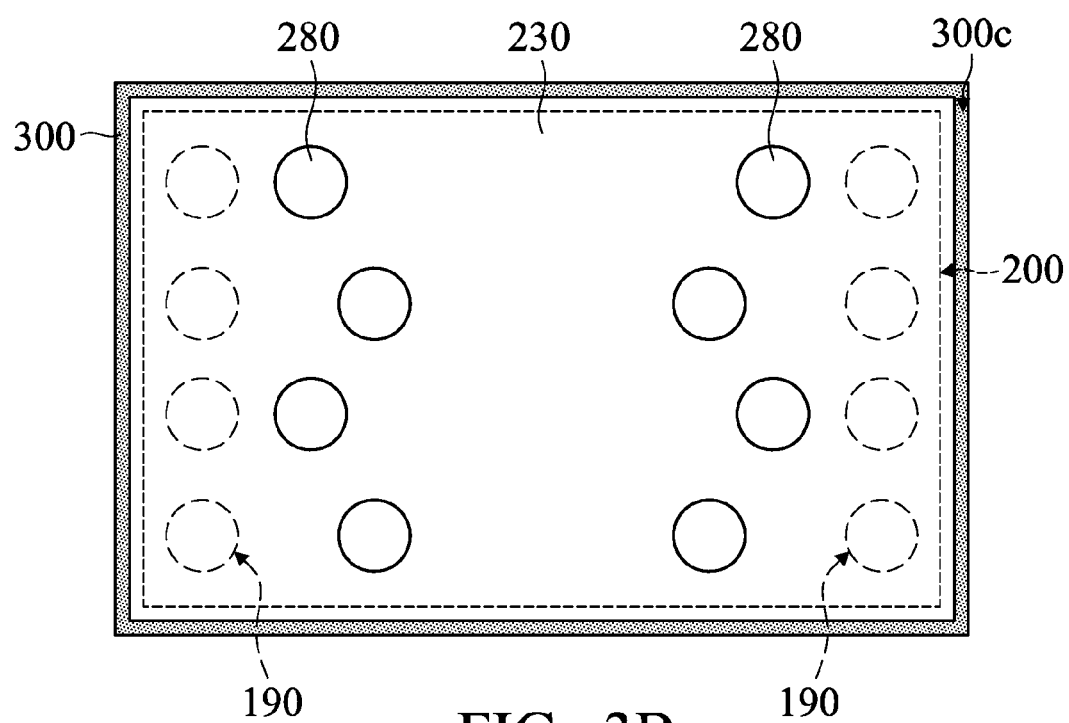

Referring to FIGS. 1I, 3A and 3B, FIG. 1I is a cross-sectional view of an exemplary embodiment of a method for forming a chip package 400 according to the invention. FIGS. 3A and 3B are top views of various exemplary embodiments of a chip package according to the invention. Chip package 400 comprises a substrate 100, a cover plate 170 and a shielding layer 300. The substrate 100 has a first surface 100a and a second surface 100b opposite thereto. In some embodiments, the substrate 100 may be a silicon substrate or another semiconductor substrate.

In some embodiments, there is a sensing region 120 in the substrate 100. The sensing region 120 may be adjacent to the first surface 100a. The sensing region 120 comprises a sensing element. In some embodiments, the sensing region 120 comprises light-sensing elements or other suitable optoelectronic elements. In some other embodiments, sensing region 120 may comprise a biometrics sensing element (such as a fingerprint-recognition element) or comprise a sensing element which is configured to sense environmental characteristics (such as a temperature-sensing element, a humidity-sensing element, a pressure-sensing element or a capacitance-sensing element) or other suitable sensing elements.

There is an insulating layer 130 on the first surface 100a of the substrate 100. In general, the insulating layer 130 may be made of an interlayer dielectric (ILD) layer, inter-metal dielectric (IMD) layers and a covering passivation layer. To simplify the diagram, only a single insulating layer 130 is depicted herein. In other words, chip package 400 including a chip/die, and the chip/die includes the substrate 100 and the insulating layer 130. In some embodiments, the insulating layer 130 may comprise an inorganic material, such as silicon oxide, silicon nitride, silicon oxynitride, metal oxide, a combination thereof, or another suitable insulating material.

In some embodiments, one or more conducting pads 140 are in the insulating layer 130 on the first surface 100a of the substrate 100. In some embodiments, the conducting pads 140 may be a single conducting layer or comprise multiple conducting layers. To simplify the diagram, only two conducting pads 140 comprising a single conducting layer in the insulating layer 130 are depicted herein as an example. In some embodiments, the insulating layer 130 comprises one or more openings exposing the corresponding conducting pads 140. In some embodiments, sensing elements in the sensing region 120 may be electrically connected to the conducting pads 140 through interconnection structures (not shown) in the substrate 100.

In some embodiments, an optical element 150 is disposed on the insulating layer 130 and corresponds to the sensing region 120. In some embodiments, the optical element 150 may be a micro-lens array, a color filter layer, a combination thereof, or another suitable optical element.

The cover plate 170 is disposed on the first surface 100a of the substrate 100 so as to protect the optical element 150. In some embodiments, the cover plate 170 may comprise glass, quartz, transparent polymer or another suitable transparent material. Furthermore, there is a spacer layer (or dam) 160 between the substrate 100 and the cover plate 170. The spacer layer 160 covers the conducting pads 140 and exposes the optical element 150. In some embodiments, the spacer layer 160, the cover plate 170 and the insulating layer 130 together surround a cavity 180 on the sensing region 120 so that the optical element 150 is located in the cavity 180.

In some embodiments, the spacer layer 160 does not substantially absorb moisture. In some embodiments, the spacer layer 160 may be non-adhesive, and the cover plate 170 is attached on the substrate 100 through an additional adhesive layer. In some other embodiments, the spacer layer 160 may itself be adhesive. The cover plate 170 can attach to the substrate 100 by the spacer layer 160 so the spacer layer 160 may contact none of the adhesion glue, thereby assuring that the spacer layer 160 will not move due to the disposition of the adhesion glue. Furthermore, since the adhesion glue is not needed, the optical element 150 can be prevented from being contaminated by an overflow of adhesion glue.

In some embodiments, the spacer layer 160 may comprise epoxy resin, inorganic materials (such as silicon oxide, silicon nitride, silicon oxynitride, metal oxide or a combination thereof), organic polymer materials (such as polyimide, butylcyclobutene (BCB), parylene, polynaphthalenes, fluorocarbons or acrylates), a photoresist material or another suitable insulating material.

Multiple openings 190 penetrates the substrate 100 and extends into the insulating layer 130, thereby exposing the corresponding conducting pad 140 from the second surface 100b of the substrate 100. In some embodiments, the diameter of the openings 190 adjacent to the first surface 100a is less than that of the openings 190 adjacent to the second surface 100b. As a result, the openings 190 have inclined sidewalls. Furthermore, an opening 200 extends along the sidewalls of the substrate 100 and penetrates the substrate 100. Namely, compared to the cover plate 170, the substrate 100 has retracted edge sidewalls. In some embodiments, the opening 200 has inclined sidewalls, that is, the substrate 100 has inclined edge sidewalls.

Furthermore, multiple openings 190 are spaced apart along the opening 200, as shown in FIG. 3B. FIG. 3B is a top view of a chip package, which is viewed along the direction from the substrate 100 toward the cover plate 170. In some embodiments, the opening 200 may extend along all the sidewalls of the substrate 100 and surround the openings 190. In some embodiments, the top-view profile of the openings 190 is different from that of the opening 200. For example, the top-view profile of the openings 190 is circular while the top-view profile of the opening 200 is rectangular, as shown in FIG. 3B. It should be realized that the top-view profiles of the openings 190 and the opening 200 may be another shape and the openings 190 and the opening 200 may have another arrangement, and they are not limited thereto.

An insulating layer 210 is disposed on the second surface 100b of the substrate 100, conformally extends to the sidewalls of the opening 190 and the sidewalls of the opening 200, and exposes the conducting pads 140. In some embodiments, the insulating layer 210 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or another suitable insulating material.

The patterned redistribution layer 220 is disposed on the second surface 100b of the substrate 100, and conformally extends to the sidewalls and the bottoms of the openings 190 without extending into the opening 200. The redistribution layer 220 may be electrically isolated from the substrate 100 by the insulating layer 210. The redistribution layer 220 may be in direct electrical contact with or indirectly electrically connected to the exposed conducting pads 140 through the openings 190. As a result, the redistribution layer 220 in the openings 190 is also referred to as a through silicon via (TSV). In some other embodiments, the redistribution layer 220 can also electrically connected to the corresponding conducting pads 140 by using the way of T-contact.

In some embodiments, the redistribution layer 220 may comprise aluminum, copper, gold, platinum, nickel, tin, a combination thereof, a conductive polymer material, a conductive ceramic material (such as indium tin oxide or indium zinc oxide), or another suitable conductive material.

A protection layer 230 is disposed on the second surface 100b of the substrate 100, and fills the openings 190 and the opening 200 to cover the redistribution layer 220. In some embodiments, the protection layer 230 has an uneven surface. For example, the surface of the protection layer 230 has a recessed part corresponding to the openings 190 and the opening 200. In some embodiments, the protection layer 230 may comprise epoxy resin, solder mask, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates), or another suitable insulating material.

In some embodiments, the openings 190 are not fully filled with the protection layer 230, so that a hole 240 is formed between the redistribution layer 220 and the protection layer 230 within the openings 190. Since the protection layer 230 partially fills the openings 190 and leaves the hole 240, the hole 240 can be a buffer between the redistribution layer 220 and the protection layer 230 in thermal cycles induced in subsequent processes. Undesirable stress, which is induced between the redistribution layer 220 and the protection layer 230 as a result of mismatch of thermal expansion coefficients, is reduced. The redistribution layer 220 is prevented from being excessively pulled by the protection layer 230 when external temperature or pressure dramatically changes. As a result, problems such as peeling or disconnection of the redistribution layer 220, which is close to the conducting pad structure, are avoidable. In some embodiments, the interface between the protection layer 230 and the hole 240 has an arcuate contour.

The protection layer 230 on the second surface 100b of the substrate 100 has openings exposing portions of the redistribution layer 220. Furthermore, multiple conducting structures 280 (such as solder balls, bumps or conductive pillars) are disposed in the openings of the protection layer 230 to electrically connect to the exposed redistribution layer 220. In some embodiments, the conducting structures 280 may comprise tin, lead, copper, gold, nickel, or a combination thereof.

In some embodiments, the shielding layer 300 has a light-shielding effect. Furthermore, the shielding layer 300 is comprised of a glue material, a photoresist material or another suitable material which can block and/or absorb light from outside. As shown in FIG. 1I, the shielding layer 300 fully covers sidewalls of the cover plate 170 and extends toward the second surface 100b of the substrate 100 so as to cover the sidewalls of the spacer layer 160. In some embodiments, the shielding layer 300 surrounds the cover plate 170 and the cavity 180 to cover all the sidewalls of the cover plate 170, as shown in FIG. 3A. FIG. 3A is a top view of a chip package, which is viewed along the direction from the cover plate 170 toward the substrate 100. Furthermore, the shielding layer 300 also surrounds the spacer layer 160 and fully covers the exposed sidewalls of the spacer layer 160.

As shown in FIG. 1I, the shielding layer 300 has an inner surface 300a, which is adjacent to the cover plate 170, and an outer surface 300b, which is away from the cover plate 170. The inner surface 300a and the outer surface 300b are both planar surface. In some embodiments, the inner surface 300a and the outer surface 300b are parallel to each other and are perpendicular to the first surface 100a and the second surface 100b. In some embodiments, the edge sidewalls of the substrate 100 (i.e. the sidewalls of the opening 200) are inclined to the inner surface 300a and the outer surface 300b of the shielding layer 300. Furthermore, the protection layer 230 extends from the second surface 100b between the edge sidewalls of the substrate 100 and the inner surface 300a.

In some embodiments, the length L1 of the inner surface 300a extends toward the second surface 100b. The length L1 is not less than the length L3 of the sidewall of the cover plate 170. The length L2 of the outer surface 300b extends toward the second surface 100b. The length L2 is not less than the length L3. Furthermore, the length L1 is not less than the length L3 plus the length L4 of the sidewall of the spacer layer 160. The length L2 is not less than the length L3 plus the length L4. In some embodiments, the length L2 is at least not less than the length L3 plus the length L4.

Figure 2:
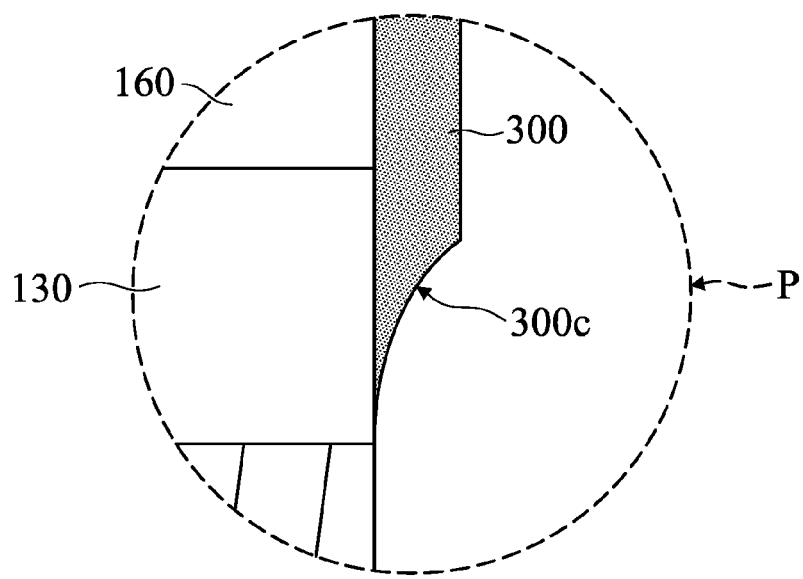
FIG. 2 is a partial cross-sectional view of an exemplary embodiment of a chip package according to the invention.

In some embodiments, the length L2 of the outer surface 300b, which extends toward the second surface 100b, is less than the length L1 of the inner surface 300a, which extends toward the second surface 100b. In some embodiments, the shielding layer 300 gradually become shorter (or thinner) along the direction from the inner surface 300a toward the outer surface 300b. That is, a lower surface 300c of the shielding layer 300, which adjoins the inner surface 300a and the outer surface 300b, has a curved contour. Multiple normal vectors of the lower surface 300c are not parallel to each other, as shown in FIG. 2. FIG. 2 is a cross-sectional view of a portion P of the chip package 400 shown in FIG. 1I.

In some embodiments, an upper surface 300d of the shielding layer 300, which adjoins the inner surface 300a and the outer surface 300b, is planar. Furthermore, the upper surface 300d of the shielding layer 300 is coplanar with the upper surface of the cover plate 170, which faces away from the substrate 100.

Figure 4:
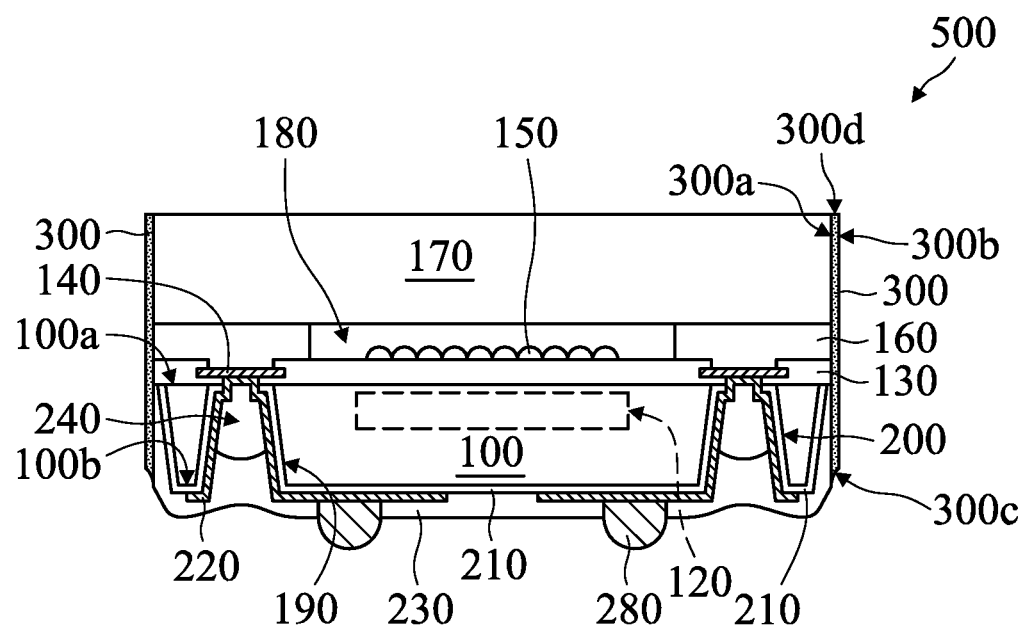
FIG. 4 is a cross-sectional view of another exemplary embodiment of a chip package according to the invention.

Referring to FIG. 4, a cross-sectional view of another exemplary embodiment of a chip package 500 according to the invention is illustrated. Elements in FIG. 4 that are the same as those in FIG. 1I are labeled with the same reference numbers as in FIG. 1I and are not described again for brevity.

The structure of the chip package 500 in FIG. 4 is similar to the structure of the chip package 400 in FIG. 1I. The difference is that the shielding layer 300 in the chip package 400 fully covers the sidewalls of the spacer layer 160 and the cover plate 170. The outer surface 300b only partially covers the sidewalls of the insulating layer 130, so that the sidewalls of the protection layer 230 are exposed from the shielding layer 300. By comparison, the shielding layer 300 in the chip package 500 fully covers the sidewalls of the insulating layer 130, the spacer layer 160 and the cover plate 170. The outer surface 300b only partially covers the sidewalls of the protection layer 230. In some embodiments, the shielding layer 300 substantially covers all sidewalls of the chip package 500. The top view of the chip package 500 is substantially the same as the top view of the chip package 400, as shown in FIGS. 3A and 3B.

Figure 5A:
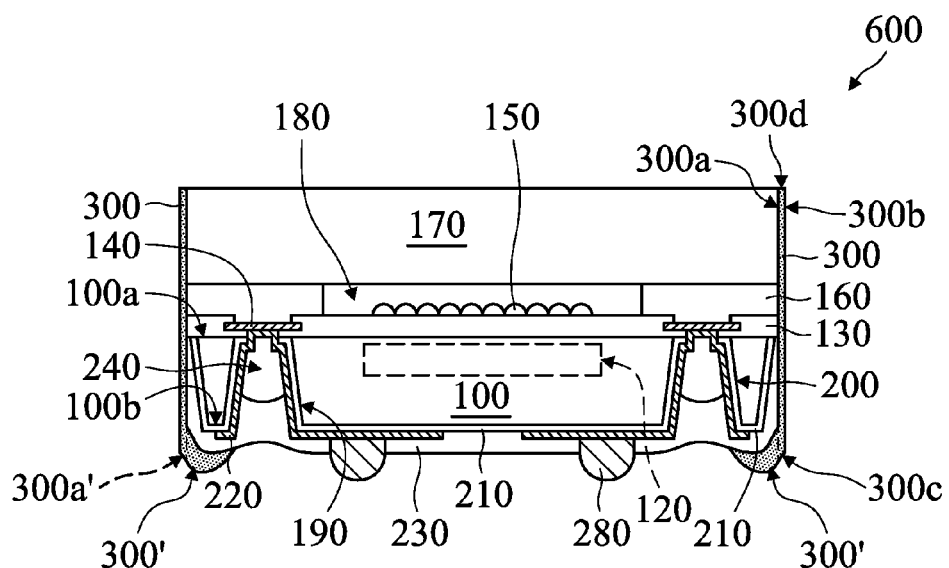
FIGS. 5A and 5B are respectively a top view and a cross-sectional view of yet another exemplary embodiment of a chip package according to the invention.
Figure 5B:
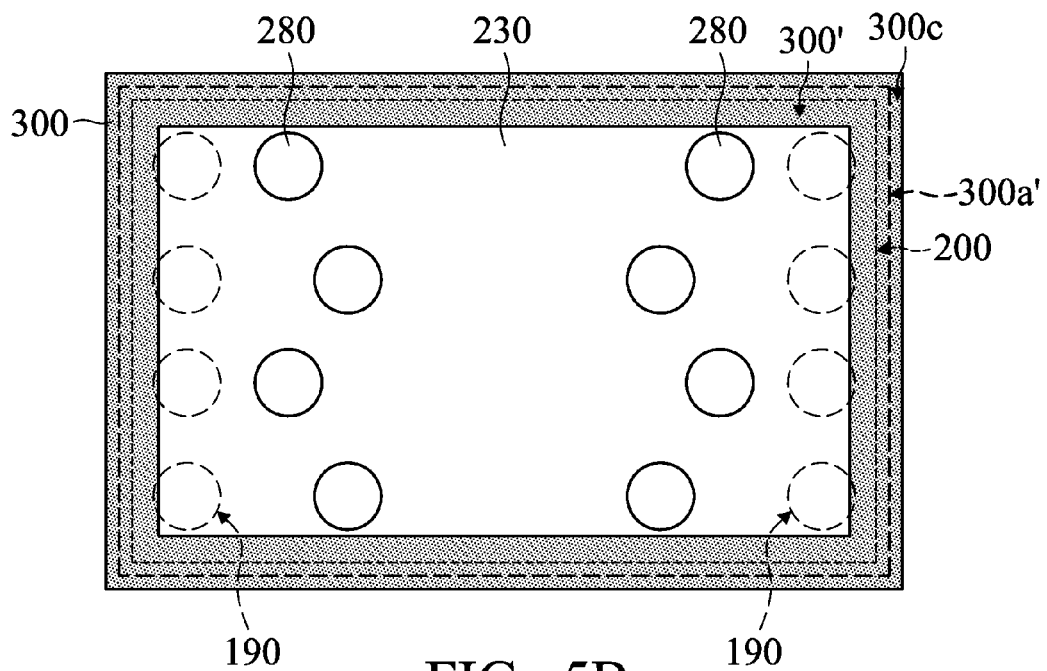

In FIGS. 5A and 5B, a top view and a cross-sectional view, respectively, of yet another exemplary embodiment of a chip package 600 according to the invention are illustrated. Elements in FIGS. 5A and 5B that are the same as those in FIG. 1I are labeled with the same reference numbers as in FIG. 1I and are not described again for brevity.

The structure of the chip package 600 in FIGS. 5A and 5B is similar to the structure of the chip package 400 in FIG. 1I. The difference is that the shielding layer 300 in the chip package 400 only covers the sidewalls of the insulating layer 130, the spacer layer 160 and the cover plate 170. The sidewalls of the protection layer 230 are exposed. By comparison, the shielding layer 300 in the chip package 600 not only fully covers the sidewalls of the insulating layer 130, the spacer layer 160, the cover plate 170 and the protection layer 230 but also extends onto the second surface 100b of the substrate 100. As a result, the shielding layer 300 fully covers all the sidewalls of the chip package 600. The top view of the chip package 600 as viewed along the direction from the cover plate 170 toward the substrate 100 is substantially the same as the top view of the chip package 400 as viewed along the direction from the cover plate 170 toward the substrate 100, as shown in FIG. 3A.

In some embodiments, the shielding layer 300 comprises a protrusion portion 300'. The protrusion portion 300' extends laterally from the inner surface 300a onto the second surface 100b and the protection layer 230. Namely, the protrusion portion 300' extends laterally from the inner surface 300a toward the direction away from the outer surface 300b. In some embodiments, a part of the protection layer 230 is sandwiched between the protrusion portion 300' and the insulating layer 210. In some embodiments, a part of the protection layer 230 is sandwiched between the protrusion portion 300' and the redistribution layer 220.

As shown in FIG. 5B, the protrusion portion 300' extends laterally from an extending line 300a' of the inner surface 300a and covers the protection layer 230. The extending line 300a' is equivalent to the edge of the protection layer 230. Furthermore, the protrusion portion 300' may partially cover the openings 190.

In some embodiments mentioned above, the chip packages 400, 500, and 600 all comprise front side illumination (FSI) sensor devices. However, in some other embodiments, the chip packages 400, 500, 600 may comprise back side illumination (BSI) sensor devices.

An exemplary embodiment of a method for forming a chip package according to the invention is illustrated in FIGS. 1A to 1I. FIGS. 1A to 1I are cross-sectional views of an exemplary embodiment of a method for forming a chip package 400 according to the invention.

Referring to FIG. 1A, a substrate 100 is provided. The substrate 100 has a first surface 100a and a second surface 100b opposite thereto, and comprises a plurality of chip regions 110. To simplify the diagram, only a complete chip region and a partial chip region adjacent thereto are depicted herein. In some embodiments, the substrate 100 may be a silicon substrate or another semiconductor substrate. In other embodiments, the substrate 100 may be a silicon wafer so as to facilitate the wafer-level packaging process.

In some embodiments, there is a sensing region 120 in the substrate 100 in each of the chip regions 110. The sensing region 120 may be adjacent to the first surface 100a. The sensing region 120 comprises a sensing element. In some embodiments, the sensing region 120 comprises light-sensing elements or other suitable optoelectronic element. In some other embodiments, sensing region 120 may comprise a biometrics sensing element (such as a fingerprint-recognition element) or comprise a sensing element which is configured to sense environmental characteristics (such as a temperature-sensing element, a humidity-sensing element, a pressure-sensing element or a capacitance-sensing element) or other suitable sensing elements.

There is an insulating layer 130 on the first surface 100a of the substrate 100. In general, the insulating layer 130 may be made of an ILD layer, IMD layers and a covering passivation layer. To simplify the diagram, only a single insulating layer 130 is depicted herein. In some embodiments, the insulating layer 130 may comprise an inorganic material, such as silicon oxide, silicon nitride, silicon oxynitride, metal oxide or a combination thereof or another suitable insulating material.

In some embodiments, one or more conducting pads 140 are in the insulating layer 130 in each of the chip regions 110. In some embodiments, the conducting pads 140 may be a single conducting layer or comprise multiple conducting layers. To simplify the diagram, only two conducting pads 140 comprising a single conducting layer in the insulating layer 130 are depicted herein as an example. In some embodiments, the insulating layer 130 in each of the chip regions 110 comprises one or more openings exposing the corresponding conducting pads 140. In some embodiments, sensing elements in the sensing region 120 may be electrically connected to the conducting pads 140 through interconnection structures (not shown) in the substrate 100.

In some embodiments, the aforementioned structure may be fabricated by sequentially performing a front-end process (for example, the sensing region 120 is formed in the substrate 100) and a back-end process (for example, the insulating layer 130, the interconnection structures, and the conducting pads 140 are formed on the substrate 100) of a semiconductor device. In other words, the following method for forming a chip package/sensing device includes subsequent packaging processes performed on the substrate after the back-end process is finished.

In some embodiments, each of the chip regions 110 comprises an optical element 150 disposed on the first surface 100a of the substrate 100 and corresponding to the sensing region 120. In some embodiments, the optical element 150 may be a micro-lens array, a color filter layer, a combination thereof, or another suitable optical element used for an image sensing device.

Afterward, a spacer layer 160 is formed on a cover plate 170. The cover plate 170 is bonded onto the first surface 100a of the substrate 100 by the spacer layer 160. The spacer layer 160 forms a cavity 180 between the substrate 100 and the cover plate 170 in each of the chip regions 110, so that the optical element 150 is located in the cavity 180 and the optical element 150 in the cavity 180 is protected by the cover plate 170. In some other embodiments, the spacer layer 160 may be formed on the substrate 100, and then bond the cover plate 170 to the substrate 100.

In some embodiments, the cover plate 170 may comprise glass, quartz, transparent polymer or another suitable transparent material. In some embodiments, the spacer layer 160 can be formed by a deposition process (such as a coating process, a physical vapor deposition process, a chemical vapor deposition process or another suitable process). Furthermore, the spacer layer 160 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or another suitable insulating material. Alternatively, the spacer layer 160 may comprise a photoresist material, and may be patterned by exposure and developing processes to expose the optical element 150.

Referring to FIG. 1B, a thinning process (such as an etching process, a milling process, a grinding process or a polishing process) using the cover plate 170 as a carrier substrate is performed on the second surface 100b of the substrate 100 to reduce the thickness of the substrate 100.

Afterwards, multiple openings 190 and an opening 200 may be simultaneously formed in the substrate 100 in each of the chip regions 110 by a lithography process and an etching process (such as a dry etching process, a wet etching process, a plasma etching process, a reactive ion etching process, or another suitable process). In some other embodiments, the openings 190 and the opening 200 may be respectively formed by a notching process and lithography and etching processes.

In some embodiments, the first openings 190 correspond to the conducting pads 140 and penetrate the substrate 100. The diameter of the first openings 190 adjacent to the first surface 100a is less than that of the openings 190 adjacent to the second surface 100b. Therefore, the openings 190 have inclined sidewalls such that the difficulty of the process for subsequently forming layers in the openings 190 are reduced, and reliability is improved. For example, since the diameter of the openings 190 adjacent to the first surface 100a is less than that of the openings 190 adjacent to the second surface 100b, layers (such as an insulating layer and a redistribution layer) subsequently formed in the openings 190 can be easily deposited on a corner between the openings 190 and the insulating layer 130 to avoid affecting electrical connection paths or inducing leakage current problems.

The opening 200 extends along the scribed lines SC between the adjacent chip regions 110 and penetrates the substrate 100, such that the substrate 100 in each of the chip regions 110 is separated from each other. That is, the substrate 100 in each of the chip regions 110 has retracted edge sidewalls. In some embodiments, the opening 200 has inclined sidewalls. That is, the substrate 100 in each of the chip regions 110 has inclined edge sidewalls.

In some embodiments, multiple openings 190 in the chip regions 110 are arranged apart along the opening 200, as shown in FIG. 3B. The openings 190 and the opening 200 are spaced apart from each other by a portion of the substrate 100 (such as a sidewall portion), as shown in FIG. 1B. In some other embodiments, a portion of the openings 190 adjacent to the second surface 100b and a portion of the opening 200 adjacent to the second surface 100b may be in communication with each other, so that the substrate 100 has a sidewall portion that is lower than the second surface 100b. In other words, the thickness of the sidewall portion is less than the thickness of the substrate 100. Since the openings 190 and the opening 200 are in communication with each other, it is possible to avoid a buildup of stress in the substrate 100 between the openings 190 and the opening 200. Stress can be mitigated and released through the opening 200, thereby preventing the sidewall portions of the substrate 100 from being cracked.

In some embodiments, the opening 200 may extend along the chip regions 110 and surround the openings 190. In some embodiments, the top-view profile of the openings 190 is different from that of the opening 200. For example, the top-view profile of the openings 190 is circular while the top-view profile of the opening 200 is rectangular, as shown in FIG. 3B. It should be realized that the top-view profiles of the openings 190 and the opening 200 may be another shape, and they are not limited thereto.

Referring to FIG. 1C, an insulating layer 210 is formed on the second surface 100b of the substrate 100 by a deposition process (such as a coating process, a physical vapor deposition process, a chemical vapor deposition process or another suitable process). The insulating layer 210 conformally extends to the sidewalls and the bottoms of the openings 190 and the opening 200. In some embodiments, the insulating layer 210 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or another suitable insulating material.

Next, the insulating layer 210 on the bottom of the openings 190 and the underlying insulating layer 130 are removed by lithography and etching processes, such that the openings 190 extend into the insulating layer 130 and expose the corresponding conducting pads 140. Furthermore, the insulating layer 210 on the bottom of the opening 200 is removed by lithography and etching processes to expose the insulating layer 130.

A patterned redistribution layer 220 is formed on the insulating layer 210 by a deposition process (such as a coating process, a physical vapor deposition process, a chemical vapor deposition process, an electroplating process, an electroless plating process or another suitable process) and lithography and etching processes. The redistribution layer 220 conformally extends to the sidewalls and the bottoms of the openings 190 without extending into the opening 200. In some embodiments, the redistribution layer 220 extends on the second surface 100b between the openings 190 and the opening 200. The redistribution layer 220 may be electrically isolated from the substrate 100 by the insulating layer 210. The redistribution layer 220 may be in direct electrical contact with or indirectly electrically connected to the exposed conducting pads 140 through the openings 190. As a result, the redistribution layer 220 in the openings 190 is also referred to as a through silicon via. In some embodiments, the redistribution layer 220 may comprise aluminum, copper, gold, platinum, nickel, tin, a combination thereof, a conductive polymer material, a conductive ceramic material (such as indium tin oxide or indium zinc oxide), or another suitable conductive material.

Referring to FIG. 1D, a protection layer 230 may be formed on the second surface 100b of the substrate 100 by a deposition process. The protection layer 230 fills the openings 190 and the opening 200 to cover the redistribution layer 220. In some embodiments, the protection layer 230 may comprise epoxy resin, solder mask, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates), or another suitable insulating material.

In some embodiments, the protection layer 230 fully fills the opening 200 but partially fills the openings 190, so that a hole 240 is formed between the redistribution layer 220 and the protection layer 230 within the openings 190. In some embodiments, the interface between the protection layer 230 and the hole 240 has an arcuate contour. In some other embodiments, the first openings 190 may be fully filled with the protection layer 230.

Next, openings 250 may be formed in the protection layer 230 on the second surface 100b of the substrate 100 by lithography and etching processes so as to expose portions of the redistribution layer 220.

Referring to FIG. 1E, a temporary carrier substrate 270 may be bonded to the upper surface of the cover plate 170, which faces away from the substrate 100, through a temporary adhesive layer 260. In some embodiments, the carrier substrate 270 may be bonded to the cover plate 170 in other steps. Furthermore, the adhesive layer 260 comprises adhesive glue or other suitable adhesive material. Furthermore, the carrier substrate 270 comprises glass, silicon or other suitable supporting substrate material.

Subsequently, conducting structures 280 (such as solder balls, bumps or conductive pillars) may be filled in the openings 250 of the protection layer 230 by a electroplating process, a screen printing process or another suitable process to electrically connect to the exposed redistribution layer 220. In some embodiments, the conducting structures 280 may comprise tin, lead, copper, gold, nickel or a combination thereof.

Referring to FIG. 1F, the protection layer 230, the insulating layer 130, the spacer layer 160 and the cover plate 170 are diced along the scribed lines SC (equivalent to along the opening 200), thereby separating the protection layer 230, the insulating layer 130, the spacer layer 160 and the cover plate 170 in each of the chip regions 110 by a trench 290. For example, a dicing saw or laser may be used to perform the dicing process, wherein a laser cutting process can be performed in order to avoid displacement of upper and lower layers.

In some embodiments, the trench 290 is located between the adjacent chip regions 110. Furthermore, the trench 290 extends from a surface of the protection layer 230 and penetrates the protection layer 230. The trench 290 then further extends to fully penetrate the cover plate 170, so that the trench 290 surrounds the substrate 100 and the cover plate 170. In some embodiments, the trench 290 may further extend into the adhesive layer 260. In some embodiments, the trench 290 has straight sidewalls. Furthermore, the diameter of the trench 290 is less than the diameter of the opening 200 and the depth of the trench 290 is greater than the depth of the opening 200, so a portion of the trench 290 is located in the opening 200.

In some embodiments, the trench 290 is at least not in contact with the edge sidewalls of the substrate 100. In some embodiments, the insulating layer 210 and the protection layer 230 are located between the trench 290 and the edge sidewalls of the substrate 100. In some other embodiments, the insulating layer 210 is sandwiched between the trench 290 and the edge sidewalls of the substrate 100.

Referring to FIG. 1G, a shielding layer 300 is filled in the trench 290. For example, the shielding layer 300 can be formed by using a dispensing process, a coating process (for example, a spin coating process or a spray coating process), a screen printing process or another suitable process. In some embodiments, the shielding layer 300 has a light-shielding effect. Furthermore, the shielding layer 300 is comprised of a glue material, a photoresist material or another suitable material which can block and/or absorb light from outside.

In some embodiments, the shielding layer 300 partially fills in the trench 290 to cover the sidewalls of the cover plate 170. In some embodiments, the shielding layer 300 at least fully covers the sidewalls of the cover plate 170. Furthermore, the shielding layer 300 may extends toward the second surface 100b of the substrate 100 so as to cover the sidewalls of the spacer layer 160. In some embodiments, an exposed surface of the shielding layer 300 has a curved contour and multiple normal vectors of the surface are not parallel to each other. Specifically, the length of a portion of the shielding layer 300, which is located at the edge of the trench 290 and extends toward the second surface 100b, is longer than the length of another portion of the shielding layer 300, which is located at the center of the trench 290 and extends toward the second surface 100b. Furthermore, the shielding layer 300 gradually becomes shorter (or thinner) along the direction from an edge of the trench 290 toward the center of the trench 290. The shielding layer 300 further gradually becomes longer (or thicker) along the direction from the center of the trench 290 toward another edge of the trench 290.

In some other embodiment, as shown in FIG. 4, the shielding layer 300 substantially fully fills the trench 290 so as to cover the sidewalls of the insulating layer 130, the spacer layer 160, the cover plate 170 and the protection layer 230. As shown in FIG. 5A, the shielding layer 300 can fully fill the trench 290 and extend onto the protection layer 230. In this case, the shielding layer 300 comprises a laterally extending protrusion portion 300'.

Referring to FIG. 1H, the shielding layer 300 is diced along the scribed lines SC (equivalent to along the trench 290), thereby forming a trench 310 in the shielding layer 300 so as to form a plurality of separated chip packages on the carrier substrate 270. For example, a dicing saw or laser can be used to perform the dicing process.

In some embodiments, the trench 310 is located between the adjacent chip regions 110 and extends from the exposed surface of the shielding layer 300 to totally penetrate the shielding layer 300. Furthermore, the trench 310 further extends into the adhesive layer 260 to make sure the plurality of chip packages are separated from each other. In some embodiments, the trench 310 has straight sidewalls. Furthermore, the diameter of the trench 310 is less than the diameter of the trench 290 and the depth of the trench 310 is less than the depth of the trench 290, so the trench 310 is completely located in the trench 290. In some embodiments, if the shielding layer 300 fills the trench 290 or further extends onto the protection layer 230, the depth of the trench 310 may be equal to or greater than the depth of the trench 290. In some embodiments, the trench 310 is at least not in contact with the sidewalls of the spacer layer 160 and the cover plate 170 to make sure the shielding layer 300 can cover the sidewalls of the spacer layer 160 and the cover plate 170.

Next, each of the separated chip packages is separated from the adhesive layer 260 and the carrier substrate 270. For example, the adhesion of the adhesive layer 260 is eliminated so as to pick up the separated chip package from the carrier substrate 270. The fabricated chip package 400 is shown in the FIG.

As show in the FIG. 1I, in the chip package 400, the sidewalls of the spacer layer 160 and the cover plate 170 are covered by the shielding layer 300. Furthermore, the shielding layer 300 surrounds the cover plate 170 to cover all the sidewalls of the cover plate 170 (as shown in the FIG. 3A). The shielding layer 300 also surrounds the spacer layer 160 to fully cover all the exposing sidewalls of the spacer layer 160. In some embodiments, since the trench 290 has a higher aspect ratio, the shielding layer 300 is unconformally filled in the trench 290. Namely, the shielding layer 300 completely fills the trench 290 in the spacer layer 160 and the cover plate 170. As a result, it can be advantageous to make sure that the shielding layer 300 fully covers the sidewalls of the cover plate 170 after forming the trench 310 in the shielding layer 300, and make the shielding layer 300 have a sufficient thickness to improve the light-shielding effect of the shielding layer 300. In addition, the shielding layer 300 filled the trench 290 in the spacer layer 160 and the cover plate 170 can avoid creating bubbles, which lead to light leakage problem, in the shielding layer 300.

In some embodiments, the shielding layer 300 also covers the sidewalls of the protection layer 230 (as shown in FIG. 4), or further extends onto the protection layer 230 (as shown in FIG. 5A). In this case, the shielding layer 300 can further block moisture and the intrusion of corrosive material into the chip packages (especially the sensing region), so as to improve the reliability and quality of the chip packages.

In some embodiments, the formation of the trench 310 causes the shielding layer 300 to have an inner surface 300a, which is adjacent to the cover plate 170, and an outer surface 300b, which is away from the cover plate 170, as shown in FIG. 1I. The inner surface 300a and the outer surface 300b are both planar surfaces. In some embodiments, the inner surface 300a and the outer surface 300b are parallel to each other and are perpendicular to the first surface 100a and the second surface 100b. In some embodiments, the edge sidewalls of the substrate 100 are inclined to the inner surface 300a and the outer surface 300b of the shielding layer 300. Furthermore, the protection layer 230 extends from the second surface 100b between the edge sidewalls of the substrate 100 and the inner surface 300a.

In some embodiments, the length L1 of the inner surface 300a extends toward the second surface 100b. The length L1 is not less than a length L3 of the sidewall of the cover plate 170. The length L2 of the outer surface 300b extends toward the second surface 100b. The length L2 is not less than the length L3. Furthermore, the length L1 is not less than the length L3 plus a length L4 of the sidewall of the spacer layer 160. The length L2 is not less than the length L3 plus the length L4. In some embodiments, the length L2 is at least not less than the length L3 plus the length L4.

In some embodiments, the length L2 of the outer surface 300b, which extends toward the second surface 100b, is less than the length L1 of the inner surface 300a, which extends toward the second surface 100b. In some embodiments, the length of the shielding layer 300 is decreasing along the direction from the inner surface 300a toward the outer surface 300b. That is, a lower surface 300c of the shielding layer 300, which adjoins the inner surface 300a and the outer surface 300b, has a curved contour. Multiple normal vectors of the lower surface 300c are not parallel to each other, as shown in FIG. 2.

In some embodiments, an upper surface 300d of the shielding layer 300, which adjoins the inner surface 300a and the outer surface 300b, is planar. Furthermore, the upper surface 300d of the shielding layer 300 is coplanar with the upper surface of the cover plate 170, which faces away from the substrate 100.

It should be realized that although some embodiments of FIGS. 1A to 1I provide a method for forming a chip package with an FSI sensing device, the method for forming external electrical connection paths of the chip (such as the opening in the substrate, the redistribution layer, the protection layer, or the conducting structures therein) and the shielding layer can be implemented to the processes of a BSI sensing device. In addition, the forming methods of the chip packages shown in FIGS. 4 and 5 are substantially similar to the forming methods of the chip package shown in FIGS. 1A to 1I.

According to the aforementioned embodiments of the invention, sidewalls of the chip package are covered by the shielding layer which has a light-shielding effect. The shielding layer can block and/or absorb light from outside of the chip package, especially the light from the lateral side of the chip package. Accordingly, the chip package can be prevented from being affected by light from outside, thereby facilitating the operation of the chip package. Therefore, the problems of petal flare and optical crosstalk, which are the result of lateral light leakage, can be effectively solved.

Specifically, sidewalls of the light-transmitted cover plate in the chip package are covered by the shielding layer. The shielding layer can block the light from the lateral side of the cover plate so as to increase the sensing accuracy of the sensing chip package. Furthermore, sidewalls of the spacer layer in the chip package are also covered by the shielding layer, thereby avoiding the moisture intruding into the chip packages from the spacer layer. Therefore, the reliability and quality of the chip packages is improved.

While the invention has been disclosed in terms of the preferred embodiments, it is not limited. The various embodiments may be modified and combined by those skilled in the art without departing from the concept and scope of the invention.

What is claimed is:

1. A chip package, comprising:
    a substrate having a first surface and a second surface opposite thereto, wherein the substrate comprises a sensing region;
    a cover plate located on the first surface and covering the sensing region; and
    a shielding layer covering a sidewall of the cover plate and extending toward the second surface, wherein the shielding layer has an inner surface which is adjacent to the cover plate and an outer surface which faces away from the cover plate, and wherein a length of the outer surface extending toward the second surface is less than a length of the inner surface extending toward the second surface and is not less than a length of the sidewall of the cover plate.

2. The chip package as claimed in claim 1, wherein the shielding layer gradually becomes shorter along a direction from the inner surface toward the outer surface.

3. The chip package as claimed in claim 1, wherein the shielding layer has a lower surface which adjoins the inner surface and the outer surface, and the lower surface has a curved contour.

4. The chip package as claimed in claim 1, wherein the shielding layer has a lower surface which adjoins the inner surface and the outer surface, and a plurality of normal vectors of the lower surface is not parallel to each other.

5. The chip package as claimed in claim 1, wherein the shielding layer has an upper surface which adjoins the inner surface and the outer surface, and the upper surface is planar.

6. The chip package as claimed in claim 1, wherein the shielding layer has an upper surface which adjoins the inner surface and the outer surface, and the cover plate has an upper surface which faces away from the substrate, and wherein the upper surface of the shielding layer is coplanar with the upper surface of the cover plate.

7. The chip package as claimed in claim 1, wherein the shielding layer surrounds the cover plate and covers all sidewalls of the cover plate.

8. The chip package as claimed in claim 1, further comprising a spacer layer located between the substrate and the cover plate, wherein the shielding layer covers a sidewall of the spacer layer.

9. The chip package as claimed in claim 1, wherein an edge sidewall of the substrate is inclined to the inner surface of the shielding layer.

10. The chip package as claimed in claim 1, further comprising a protection layer located on the second surface of the substrate, wherein the protection layer extends between an edge sidewall of the substrate and the inner surface of the shielding layer.

11. The chip package as claimed in claim 1, wherein the shielding layer comprises a protrusion portion laterally extending from the inner surface onto the second surface.

12. A method for forming a chip package, comprising:
providing a substrate having a first surface and a second surface opposite thereto, wherein the substrate comprises a sensing region;
providing a cover plate on the first surface to cover the sensing region; and
forming a shielding layer covering a sidewall of the cover plate and extending toward the second surface, wherein the shielding layer has an inner surface which is adjacent to the cover plate and an outer surface which faces away from the cover plate, and wherein a length of the outer surface extending toward the second surface is less than a length of the inner surface extending toward the second surface and is not less than a length of the sidewall of the cover plate.

13. The method as claimed in claim 12, further comprising dicing the cover plate to form a trench before forming the shielding layer, wherein the shielding layer fills in the trench to cover the sidewall of the cover plate.

14. The method as claimed in claim 13, further comprising forming an opening in the substrate before dicing the cover plate, wherein the opening penetrates the substrate, and the cover layer is diced along the opening.

15. The method as claimed in claim 14, further comprising forming a protection layer on the second surface of the substrate after forming the opening and before dicing the cover plate, wherein the protection layer extends in the opening, and the protection layer and the cover plate are diced along the opening so that the trench penetrates the protection layer, and wherein the protection layer is located between the shielding layer and the substrate after forming the shielding layer.

16. The method as claimed in claim 13, further comprising providing a carrier substrate on an upper surface of the cover plate, which faces away from the substrate, before dicing the cover plate.

17. The method as claimed in claim 13, further comprising dicing the shielding layer along the trench after the shielding layer fills in the trench so that the shielding layer has the inner surface, which is adjacent to the cover plate, and the outer surface, which faces away from the cover plate.

18. The method as claimed in claim 17, wherein a length of a portion of the shielding layer, which is located at an edge of the trench and extends toward the second surface, is longer than a length of an another portion of the shielding layer, which is located at a center of the trench and extends toward the second surface, before dicing the shielding layer.

19. The method as claimed in claim 17, wherein the shielding layer gradually becomes shorter along a direction from an edge of the trench toward a center of the trench before dicing the shielding layer.

20. The method as claimed in claim 17, wherein a plurality of normal vectors of a surface of the shielding layer is not parallel to each other before dicing the shielding layer.

21. The method as claimed in claim 17, wherein the step of dicing the shielding layer comprises performing a dicing process using a dicing saw or laser.

22. The method as claimed in claim 12, wherein the step of forming the shielding layer comprises performing a dispensing process, a coating process or a screen printing process.

* * * * *